United States Patent [19]

Hekhuis

[11] Patent Number: 5,414,650
[45] Date of Patent: May 9, 1995

[54] PARSING INFORMATION ONTO PACKETS USING CONTEXT-INSENSITIVE PARSING RULES BASED ON PACKET CHARACTERISTICS

[75] Inventor: Peter J. Hekhuis, Ashland, Oreg.

[73] Assignee: Compression Research Group, Inc., Ashland, Oreg.

[21] Appl. No.: 35,438

[22] Filed: Mar. 24, 1993

[51] Int. Cl.$^6$ .............................. G06F 13/00
[52] U.S. Cl. ...................... 364/715.02; 341/51
[58] Field of Search ......................... 341/51; 395/700

[56] References Cited

U.S. PATENT DOCUMENTS

| | | | |
|---|---|---|---|
| 4,876,541 | 10/1989 | Storer | 341/51 |
| 5,138,673 | 8/1992 | Yoshida et al. | 382/56 |
| 5,151,697 | 9/1992 | Burton | 341/51 |
| 5,239,298 | 8/1993 | Wei | 341/51 |
| 5,259,990 | 10/1993 | Yoshida et al. | 341/51 |
| 5,361,353 | 11/1994 | Carr et al. | 395/700 |

OTHER PUBLICATIONS

Peter K. Pearson, "Fast Hashing of Variable-Length Text Strings," Communications of the ACM, Jun. 1990, vol. 33, No. 6, pp. 677-680.

Yokoo, Hidetoshi, Improved Variations Relating the Ziv-Lempel and Welch-Type Algorithms For Sequential Data compression, IEEE 1992.

Ferro, Manuel V., "Efficient Ineremental Parsing For Context-Free Languages", 1994 IEEE.

Primary Examiner—Kevin A. Kriess
Assistant Examiner—Matthew M. Payne
Attorney, Agent, or Firm—Thomas A. Gallagher; David N. Lathrop

[57] ABSTRACT

Extremely localized parse rules, dependent only upon either intrinsic characteristics of each packet or upon transitions in characteristics between consecutive pairs or triples of packets, give a determinable fragmentation of an information stream which is relatively insensitive to imbedded error, insertion or deletion. Iterative application of such parsing on the stream of parsed fragments produces a corresponding hierarchy of levels of fragments of increasing length. The highest level fragments are matched to a dictionary or history, tokenized and presented for output to form a compressed data stream.

20 Claims, 5 Drawing Sheets

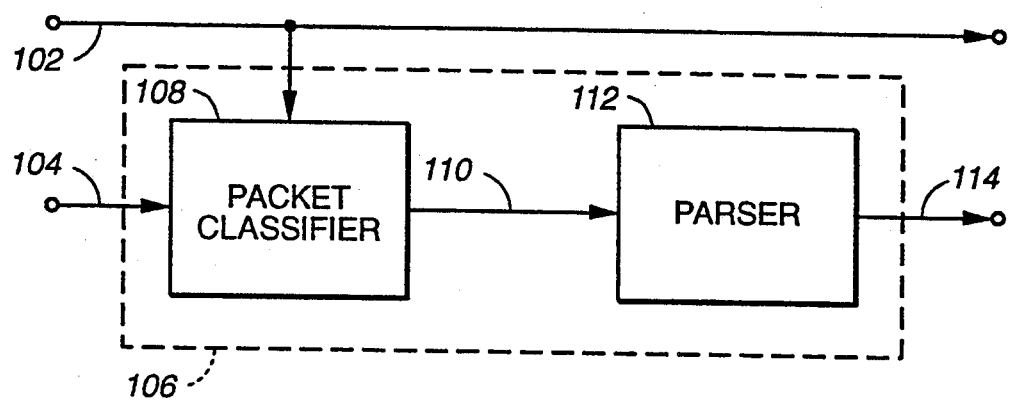
FIG._1
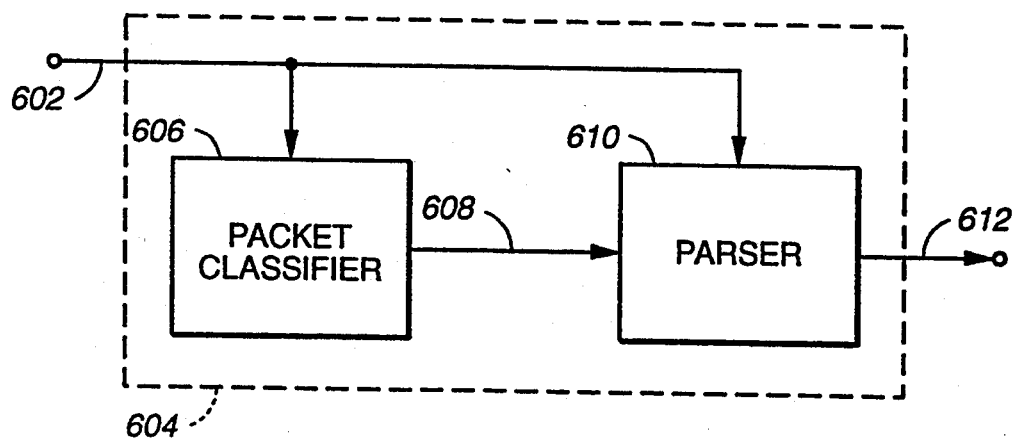
FIG._6

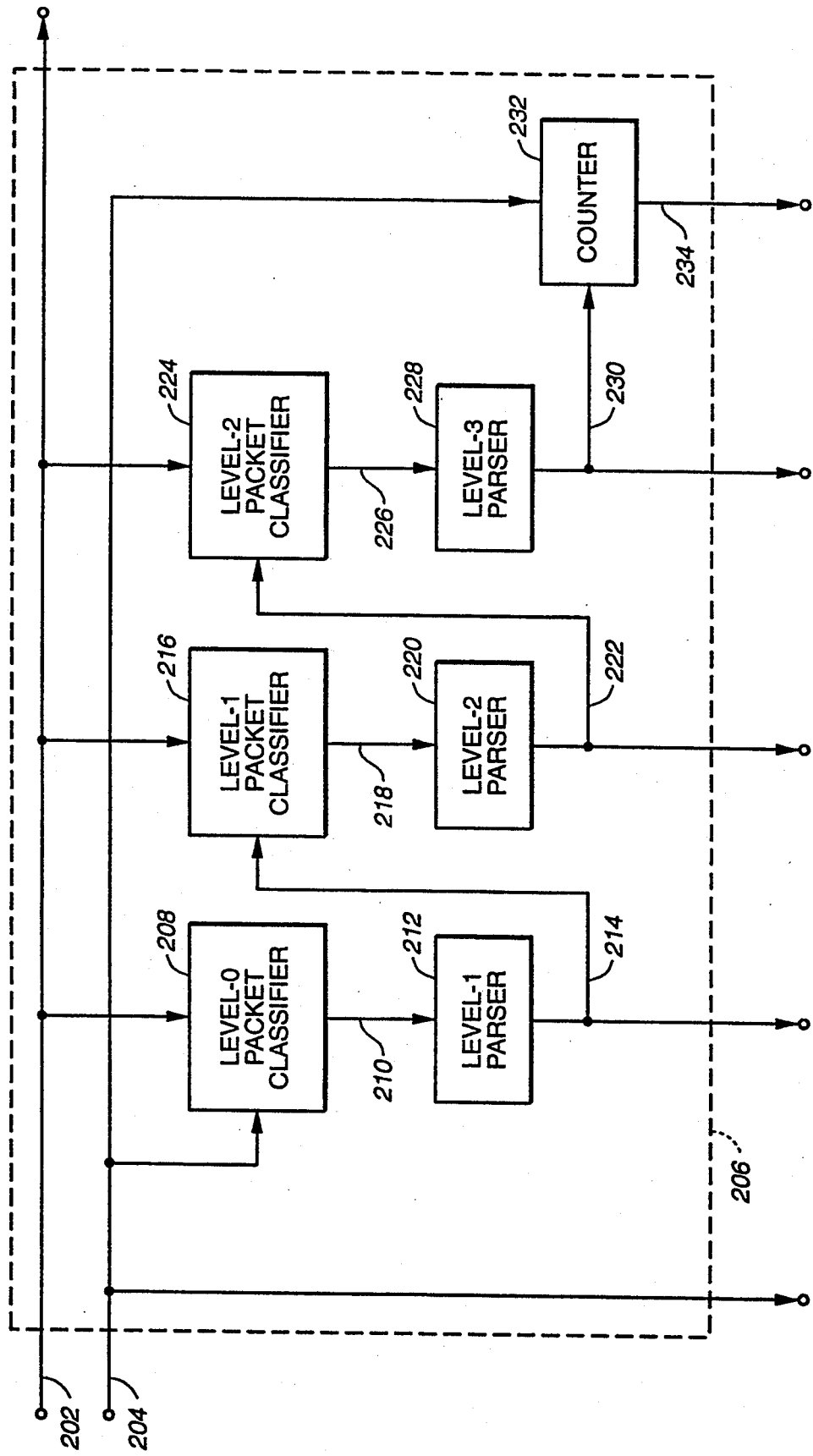
FIG._2

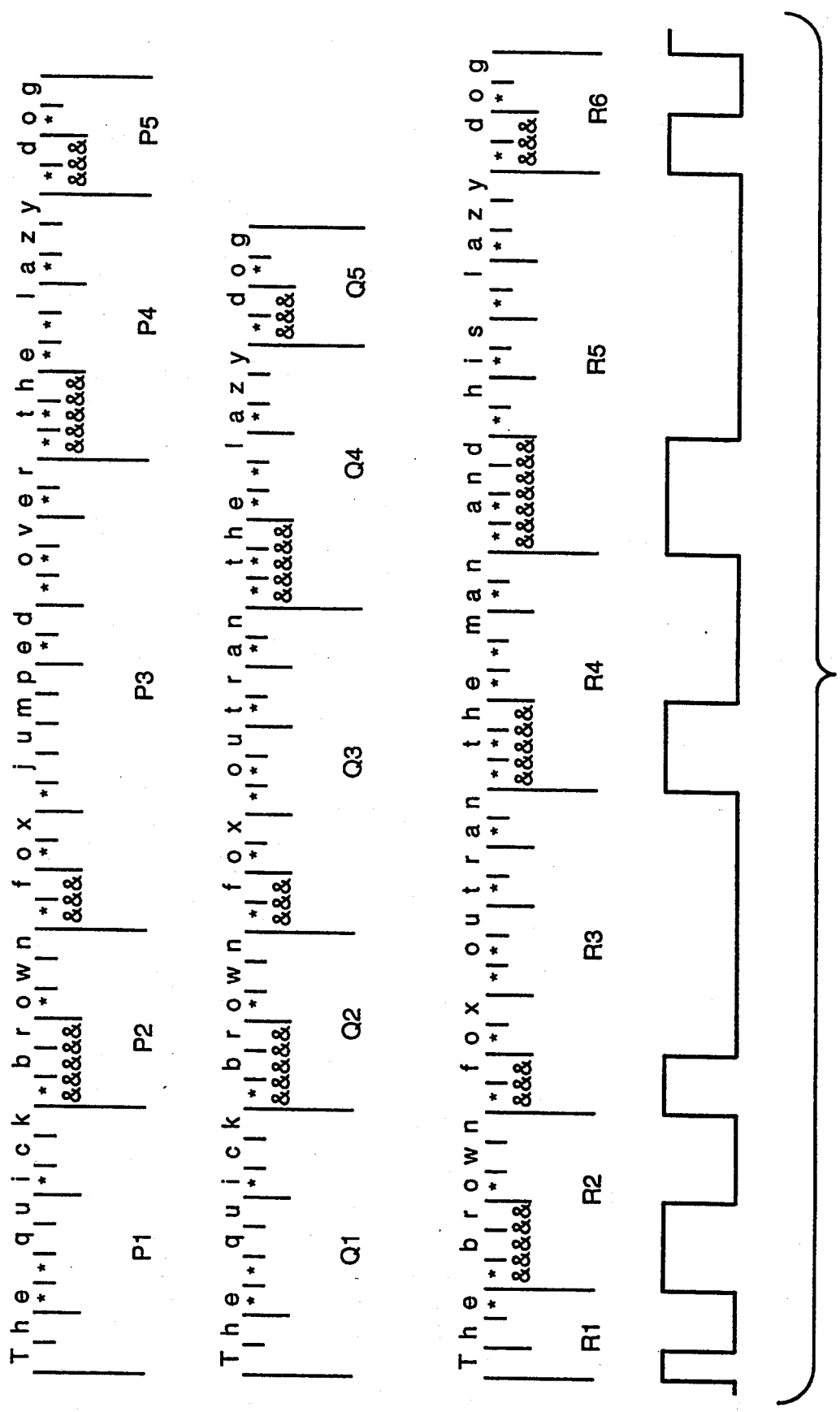
FIG._3

.....BBAABAAABBBABABBAA.....
FIG._4A
.....BBAABAAABBBABABBAA.....
FIG._4B
FIG._5
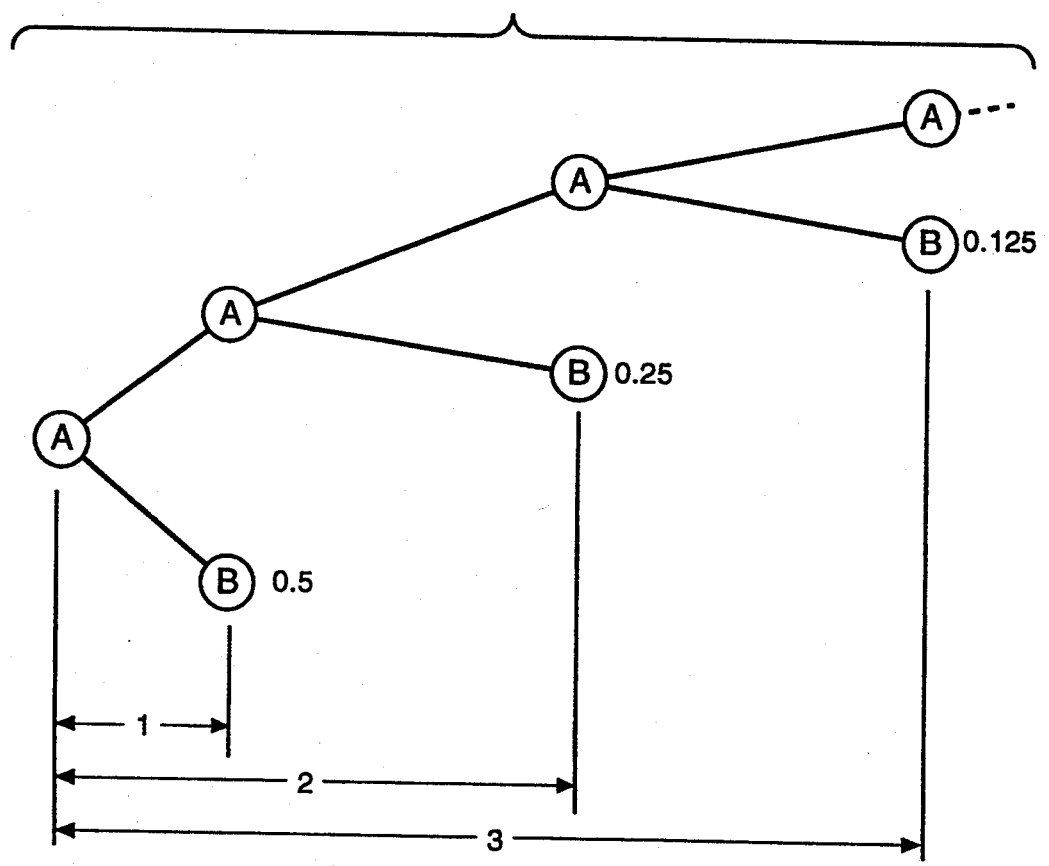

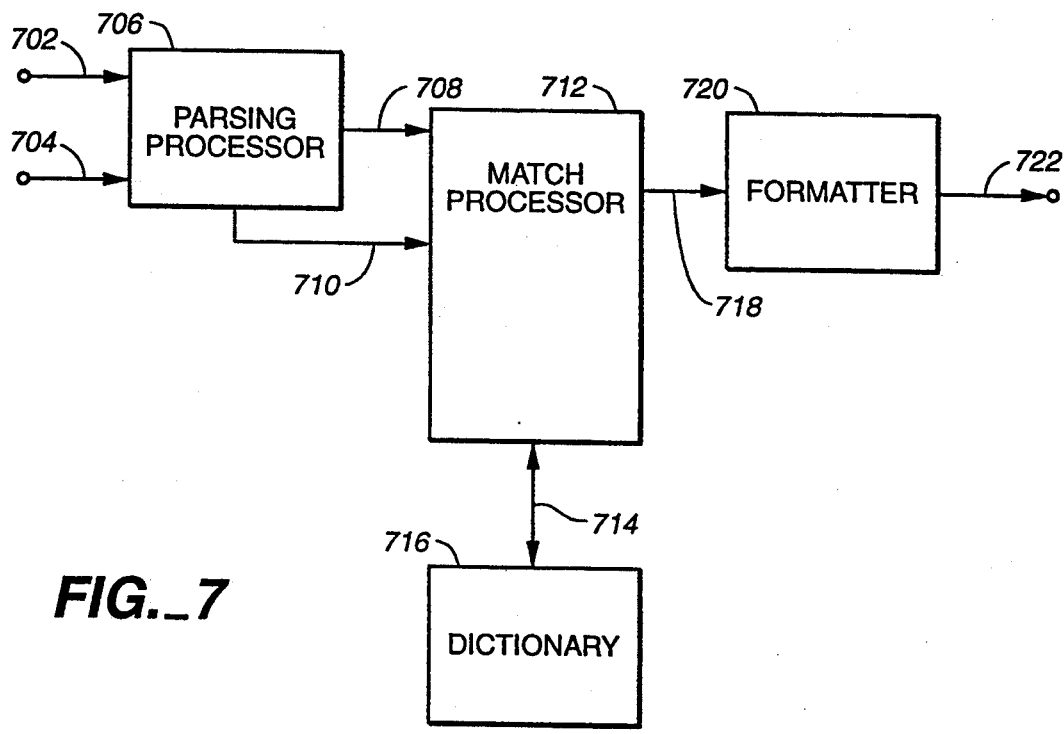
FIG._7
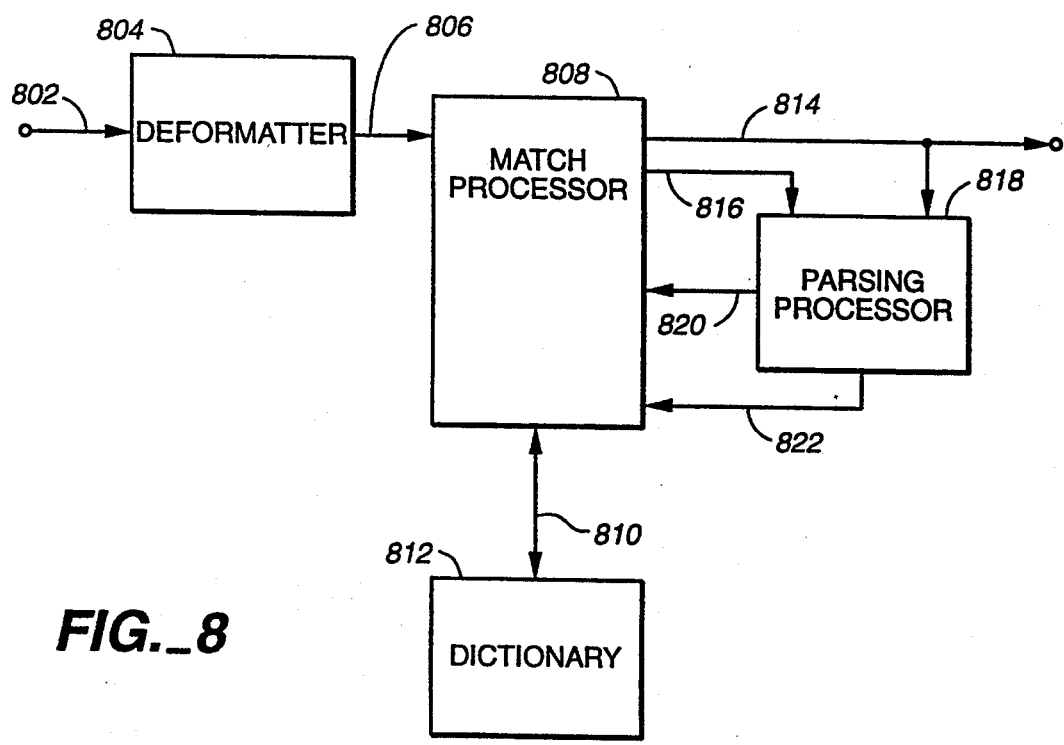
FIG._8

PARSING INFORMATION ONTO PACKETS USING CONTEXT-INSENSITIVE PARSING RULES BASED ON PACKET CHARACTERISTICS

TECHNICAL FIELD

The invention relates in general to information storage and communication, and relates more particularly to the parsing of information streams into groups or packets of information so as to improve the performance of various information processing applications such as data compression and file-contents verification.

BACKGROUND ART

There is considerable interest among those in the fields of information storage and communication to reduce the capacity requirements of information so that the information can be stored on storage media and/or transmitted through communication channels having lower capacity than otherwise required. Information represented in forms having reduced capacity requirements can be stored in less space and can be transmitted over communication channels having, for example, lower bandwidth or lower bit rates.

Data "compression" is one technique sometimes used to reduce information capacity requirements. As used herein, the term data "compression" refers to a process of generating an output representation of information in response to an input information stream where the output representation requires fewer data elements than the input stream. The output representation is said to be a "compressed" representation. Data compression is well known and a number of techniques are reviewed by Williams, *Adaptive Data Compression,* Kluwer Academic Publishers, 1991, pp. 1–104, by Bell, Cleary and Witten, *Text Compression,* Prentice-Hall, 1990, and by Storer, *Data Compression,* Computer Science Press, 1988.

Data "decompression" refers to the inverse process used to recover the information stream from a compressed representation. A compression technique is "lossless" if the inverse decompression technique can perfectly recover the input information stream from the compressed representation.

Lempel-Ziv or LZ methods constitute a well known class of lossless compression techniques which parse an input stream into "packets" of information and generate a "token" to represent a group of packets having the same contents. The term "packet" as used herein refers to any convenient grouping of information. Such techniques are referred to as "substitutional" techniques because a token is "substituted" for the contents of a packet. To the extent the token imposes lower information capacity requirements than the packet information it represents, the resulting representation is compressed. "Compression ratios" in excess of 3:1 are not unusual for normal English text; that is, the compressed representation imposes an information capacity requirement one-third of that imposed by the input information stream.

Substitutional compression methods normally use either a "dictionary" or "history" structure to improve the efficiency of token substitution. A history is a particular type of dictionary which is constructed during a compression process and contains tokens representing packets in a portion of an information stream currently held in a buffer. As packets occurring later in the stream are received into the buffer, older packets in the buffer must be discarded. The corresponding tokens in the history can also be discarded. Other dictionary schemes may use more sophisticated buffering techniques which, for example, discard the least-recently-used packets and tokens as later packets are received into the buffer. The term "dictionary" is used herein to refer to a structure which defines a token in terms of the information it represents and which indexes each occurrence of token substitution in the compressed representation. The "defining packet" contains the information which defines that meaning of the token in the compressed representation.

Known compression techniques such as LZ methods attempt to optimize the compression of an input information stream, such as text from a document, by attempting to achieve the highest possible compression ratio. Compression can be enhanced by increasing the packet-to-token ratio or packet-token ratio, which is the number of times a token can be used to represent different instances of packets containing the same information. Compression can also be enhanced by decreasing the information capacity requirements of a token relative to the capacity requirements of the packets it represents. The relative information capacity requirements of tokens as compared to packets can generally be improved by increasing the size or information capacity of each packet; however, this tends to reduce the packet-token ratio in many prior art compression methods. As a result, attempts to optimize the compression ratio generally must balance this ratio against packet size.

The packet-token ratio is especially significant for the compression of large-volume information streams and the compression of multiple information streams, particularly multiple generations of information where each generation is an altered version of the previous generation. Known compression techniques are unable to achieve effective packet-token ratios because parsing is "context sensitive." Even minor changes in the contents of an information stream can radically alter what packets are parsed from the stream.

In contrast to the parsing of LZ and other methods, "context insensitive" parsing will parse similar information streams into identical packets except for the packets parsed from portions of the streams near the dissimilarities. As a result, the packet-token ratio can be much greater. It should be appreciated that each of the information streams may represent a distinct document or different sections from one document, for example.

DISCLOSURE OF INVENTION

It is an object of the present invention to provide for an information compression technique using context-insensitive parsing.

It is another object of the present invention to provide for an information compression technique using context-insensitive parsing which may utilize a wide variety of processing rules.

It is a further object of the invention to provide for an information processing method using context insensitive parsing.

These objects and other objects which are discussed throughout this description are achieved by the invention as claimed.

In accordance with the teachings of one aspect of the present invention, an information processor (a) receives an information stream containing input packets; (b) classifies each input packet; (c) parses the input stream into output packets each containing one or more input packets in response to the classification; and (d) generates tokens representing each output packet.

In accordance with the teachings of another aspect of the present invention, an information processor (a) receives an input information stream containing level-0 packets; (b) classifies each level-0 packet; (c) generates an intermediate information stream by parsing, in response to the first classification, the input information stream into level-1 packets each containing one or more level-0 packets; (d) generates tokens representing each level-1 packet; (e) classifies each level-1 packet in the intermediate information stream; (f) parses, in response to the second classification, the intermediate information stream into level-2 packets each containing one or more level-1 packets; and (g) generates tokens representing each level-2 packet.

In accordance with yet another aspect of the present invention, an information processor similar to the one recited in the previous paragraph generates higher level tokens by reiterating steps (e) through (g) for each additional level.

In accordance with the teachings of a further aspect of the present invention, an information processor parses an input information stream into packets, generates tokens representing each packet, and builds a dictionary by adding a token-packet reference if such a reference does not yet exist in the dictionary.

In accordance with the teachings of yet a further aspect of the present invention, an information processor parses an input information stream into two or more levels of packets, generates tokens representing each packet, and builds a multiple-level dictionary by adding a token-packet reference to the appropriate level of the dictionary if such a reference does not yet exist in the dictionary at that level.

In one embodiment for a particular application, an information processor incorporating one aspect of the present invention receives an input information stream of text characters encoded according to the American Standard Code for Information Interchange (ASCII). The information stream contains byte-sized level-0 packets of one ASCII character each. The information processor classifies each level-0 packet into one of two types and, in response to the classification, parses the input information stream into level-1 packets of one or more text characters each and generates a token for each level-1 packet.

As discussed above, an information stream containing level-1 packets may be further parsed into higher-level packets and a token generated for each higher-level packet. Generally, higher-level packets contain more information than lower-level packets. Practical considerations may impose limits upon actual embodiments of an information processor incorporating various aspects of the present invention but, in principle, the present invention is not limited to any particular number of levels or length of packets.

The term "processing rules" is used herein to refer to various rules used to classify packets, parse information streams into packets, assign tokens to the packets, and maintain dictionary structures. The present invention may be practiced with a wide variety of processing rules. In spite of this flexibility, however, certain rules achieve better performance than others. The processing rules for preferred and alternate embodiments are discussed throughout the following description.

A broad range of token assignment techniques may be used to practice the present invention. One well known technique assigns tokens by incrementing a sequential identifier in response to the occurrence of a packet having contents which are not currently represented in a dictionary by any token. Sequential identifiers provide a very compact token but are suitable only for applications in which the relationship between each token and the defining packet can be carefully controlled for all participants. This often means that all participants must use the same dictionary.

Another technique assigns tokens based upon the physical location of the defining packet within the compressed representation. Physical offsets are similar to sequential identifiers in that the token-packet relationship must be carefully controlled for all participants. Generally, a physical offset is not as compact as a sequential identifier but it may be more efficient because an index is not required to point to the defining packet. The offset directly refers to the defining packet.

A third technique utilizes an algorithm to generate tokens. Generally, algorithms generate tokens which are not nearly as compact as sequential identifiers or physical offsets, but they are suitable for applications in which not all participants can use the same dictionary.

Information processors incorporating the present invention may use a wide variety of dictionary structures including history structures. No specific dictionary structure is critical to the practice of various aspects of the present invention; however, the choice of the dictionary structure can have significant affects upon processing performance.

The present invention is generally applicable to a wide range of information processing applications in addition to information compression. For example, an information processor incorporating various aspects of the present invention can generate a token structure which may be used to efficiently verify the contents of an information stream such as a computer file. File content verification can be used to detect so-called computer viruses or to verify the correct transmission of computer files. The token structure can also be used to manage file comparison functions intended to detect differences between two or more files. Additional applications will be apparent to those skilled in various areas of information processing.

Various aspects of the present invention and its preferred embodiments are set forth in greater detail in the following "Modes for Carrying Out the Invention" and in the accompanying drawings. It should be appreciated that the following discussion sets forth several embodiments by way of example only and that the examples are not intended to set forth any limitations in application or implementation. In particular, several examples are directed toward the compression of textual information streams. The present invention applies to a variety of information processing applications and is not limited to compression applications. Furthermore, the present invention is not limited to textual information. It can be applied to information such as executable program modules, binary data, and bit-mapped images.

BRIEF DESCRIPTION OF DRAWINGS

FIG. 1 is a functional block diagram illustrating the structure of one aspect of the present invention pertaining to packet classification and parsing.

FIG. 2 is a functional block diagram illustrating a multiple-level embodiment of the structure shown in FIG. 1.

FIG. 3 illustrates examples of parsing an information stream and a hypothetical graphical representation of an aperiodic square-wave signal having transitions corresponding to level-1 packet boundaries.

FIGS. 4a-4b illustrate examples of two variations of a parsing rule.

FIG. 5 is a hypothetical graphical representation of various packet lengths and their probability of occurrence.

FIG. 6 is a functional block diagram illustrating an alternate structure of one aspect of the present invention pertaining to packet classification and parsing.

FIG. 7 is a functional block diagram illustrating the structure of one embodiment of an information compression processor incorporating one aspect of the present invention substantially in accordance with the structure shown in FIG. 2.

FIG. 8 is a functional block diagram illustrating the structure of one embodiment of an information decompression processor incorporating one aspect of the present invention substantially in accordance with the structure shown in FIG. 2.

MODES FOR CARRYING OUT THE INVENTION

A. Parsing

1. Structure

FIG. 1 illustrates a functional block diagram of the structure of one aspect of the present invention. Parsing processor 106 comprises packet classifier 108 and parser 112. Packet classifier 108 receives from path 102 an information stream, receives from path 104 an indication of the boundaries between input packets within the information stream, and passes along path 110 the classification of each input packet. Parser 112 receives from path 110 each input packet classification and passes along path 114 an indication of the boundaries between output packets within the information stream. A broad variety of packet classification rules and parsing rules may be used to practice the present invention.

FIG. 2 illustrates a multiple-level embodiment of the structure illustrated in FIG. 1. Parsing processor 206 comprises packet classifiers 208, 216 and 224, parsers 212, 220 and 228, and counter 232.

Level-0 packet classifier 208 receives from path 202 an information stream, receives from path 204 an indication of the boundaries between level-0 packets within the information stream, and passes along path 210 the classification of each level-0 packet. Level-1 parser 212 receives from path 210 each level-0 packet classification and passes along path 214 an indication of the boundaries between level-1 packets within the information stream.

Level-1 packet classifier 216 receives from path 202 the information stream, receives from path 214 an indication of the boundaries between level-1 packets within the information stream, and passes along path 218 the classification of each level-1 packet. Level-2 parser 220 receives from path 218 each level-1 packet classification and passes along path 222 an indication of the boundaries between level-2 packets within the information stream.

Level-2 packet classifier 224 and parser 228 perform in like manner, classifying the level-2 packets and passing along path 230 an indication of the boundaries between level-3 packets within the information stream.

Counter 232 passes along path 234 the number of level-0 packets received from path 202 since the last level-3 packet boundary by incrementing a counter in response to each indication of a level-0 packet boundary received from path 204 and resetting the counter in response to the indication of a level-3 packet boundary received from path 230. Counter 232 is not critical to the practice of the present invention and may be omitted as desired. Many variations are also possible. For example, a distinct counter may be used for each level of the structure.

2. Packet Classification Rules

Although a "packet" may be any convenient grouping of information, a particular application will often dictate the characteristics of a basic or "fundamental" packet. For example, fundamental packets may contain one binary bit, one 8-bit byte, two 24-bit floating point numbers, or a variable length string of ASCII encoded characters terminated by a space. By definition, an information stream comprises a sequence of fundamental packets.

Information processors incorporating various aspects of the present invention usually work with multiple levels of packets. A level n+1 packet comprises one or more level n packets. The fundamental packet is the lowest level packet; therefore, packets at all other levels may be defined in terms of the fundamental packet. For ease of discussion, the fundamental packet is sometimes referred to as a level-0 packet or an input packet.

Packet classification rules establish to which of two or more classes a packet belongs and may be described as either "intrinsic" rules or "transition" rules.

"Intrinsic" classification rules classify a packet according to some intrinsic characteristic of the packet. Examples of intrinsic rules include: classifying packets consisting of one ASCII character according to the specific character they contain; classifying packets containing one binary bit according to the value of the bit; classifying packets containing a numeric quantity according to the value of the numeric quantity; and classifying packets containing variable-length strings according to the number of characters in the string. Classification may be based upon more than one intrinsic characteristic.

A preferred embodiment for many applications implements the intrinsic rules with a hashing function. The choice of hashing techniques is not critical to the practice of the present invention; however, a particularly efficient hashing function for applications with variable-length strings is set forth in Pearson, "Fast Hashing of Variable-Length Text Strings," *Computing Practices*, vol. 33, June 1990, pp. 677-80.

"Transition" classification rules classify a packet by comparing some quantitative characteristic of two or more packets in a sequence within the information stream. Quantitative characteristics may be based upon quantities such as ASCII codes, numeric values of digital words, and lengths of text strings. Classification may be based upon the comparison of more than one quantitative characteristic.

For example, one transition rule classifies the second of two packets $P_1P_2$ as either a type "A" packet or a type "B" packet according to the ASCII code each packet contains. Packet $P_2$ is type "A" if it contains an ASCII code which is less than the ASCII code contained in the preceding packet $P_1$. This rule may be conveniently represented as $$P_2 = A \text{ if } |P_2| < |P_1|, P_2 = B \text{ otherwise.} \quad (1)$$

Transition rules may also compare more than two packets. For example, one rule classifies the second of three packets $P_1 P_2 P_3$ as a type "A" packet if its quantitative characteristic is less than the characteristic of the first packet and less than or equal to the characteristic of the third packet, represented as $$P_2 = A \text{ if } |P_2| < |P_1| \text{ and } |P_2| \leq |P_3|, P_2 = B \text{ otherwise.} \quad (2)$$

For preferred embodiments, a transition rule classifies the last of a sequence of packets in order to minimize processing delays and memory requirements.

For reasons which will be explained below, it is generally preferable to establish classification rules, whether intrinsic or transition, such that the occurrence of the various packet classifications are uncorrelated, and that the frequency of occurrence of packets in each of the classes is substantially equal.

It is not unusual for sequences of the same packet or sequences of packets with monotonically increasing or decreasing characteristics to appear in information streams. Strings of "space" characters and strings of binary zeroes frequently occur in text and binary streams, respectively. As mentioned above and discussed more fully below, it is preferable to avoid long strings of correlated packet classifications. Monotonic sequences usually occur only at level-0, but strings of repeating packets can occur at all levels.

Preferred embodiments of the present invention handle as a special case sequences of packets with identical characteristics. Preferred embodiments should handle as a special case sequences of packets with monotonically changing characteristics only if such a sequence produces a string of correlated packet classifications. If a sequence of two or more consecutive packets have identical characteristics, or if a sequence of three or more packets have monotonically increasing or decreasing characteristics, then the characteristics are modified in a predictable way prior to packet classification.

In one embodiment, the characteristic of the first packet in such sequences is used to seed a pseudo-random number generator which then generates a sequence of characteristics for the remaining packets in the sequence.

As an alternative, sequences of repeating packets may be converted into monotonic sequences prior to classification provided the classification technique generates uncorrelated classifications in response to monotonic sequences. For example, in an embodiment using a hashing function which tends to randomize packet classification based upon the packet characteristic, a sequence of binary-zero valued packets are modified into the sequence (0, 1, 2, . . . ) prior to classification by hashing.

It should be emphasized that the packet characteristic is modified only for the purpose of classification. Packet contents are not changed.

Statistical properties of packet characteristics may be used to construct a static model from which a good classification scheme may be selected. For example, packets known to have a characteristic which is expected to occur more often than some threshold frequency may be classified as "cardinal" packets and all other packets are classified as "collateral" packets. In one embodiment of an intrinsic classification rule for packets containing a single ASCII character, cardinal packets for English text applications are those packets containing the "space" or any of the lowercase letters a, e, i, o and t. This classification rule may be restated as $$P = \text{cardinal if } P \in \{\text{" "}, \text{"a"}, \text{"e"}, \text{"i"}, \text{"o"}, \text{"t"}\},$$
$$P = \text{collateral otherwise.} \quad (3)$$

In such a scheme, each variety of cardinal packet such as packets containing an "e" is expected to occur more frequently than any variety of collateral packet such as packets containing a "q". This rule is discussed in several examples of parsing described below.

This particular cardinal/collateral classification rule may be implemented by a table lookup process using a very small table for cardinal packets. An alternative rule could classify packets according to two sets of characters chosen such that the frequency of occurrence of the two sets is substantially equal.

Classification rules may classify packets into more than two classes and may be a hybrid combination of intrinsic and transition rules, but more particular mention is made throughout the remainder of this discussion to either intrinsic or transition "two-state" rules which classify packets into only two classes.

3. Parsing Rules

The term "parsing" as used herein refers to the process of establishing boundaries between packets at level $n+1$ in an information stream containing packets at level n. As described above, each level $n+1$ packet contains one or more level n packets; therefore, the level $n+1$ packet boundaries are a proper subset of the level n packet boundaries.

Context-insensitive parsing attempts to minimize the number of differences in packet boundaries between similar streams or between similar portions of streams. Ideally, these differences are confined to only those boundaries which are near the dissimilarities. One example of context-insensitive parsing according to one aspect of the present invention is shown in FIGS. 3a through 3c for three different information streams.

FIG. 3a illustrates an example of level-1 and level-2 parsing of a first information stream of text characters. The fundamental or level-0 packet for this stream is defined to be each character in the stream. Each level-0 packet is classified as either a cardinal packet or a collateral packet according to rule 3 described above. The lines between and immediately below pairs of characters represent level-0 packet boundaries, and an asterisk (*) is used to indicate which of the level-0 packets are cardinal packets.

The longer lines shown in the figure also represent the resulting level-1 and level-2 packet boundaries established by parsing. According to the example, the parsing rules establish level-1 packet boundaries just before any cardinal packet which is immediately preceded by a collateral packet. For example, the string "br" from the word "brown" forms a level-1 packet. The parsing rules establish level-2 packet boundaries just before any level-1 cardinal packet that immediately follows a collateral packet. In practical embodiments, sets defining higher-level cardinal packets are often established from statistical models. For ease of discussion in this example, however, level-1 cardinal packets are defined from the set {"and", "br", "d", "f", "ing", "th"}. The ampersand character (&) indicates which of the level-1 packets are cardinal packets. Referring to FIG. 3a, for example, the string "own f" forms a level-2 packet. The labels such as $P_2$ under the "brown" packet are shown only to provide a convenient way to refer to specific level-2 packets.

Boundaries may also be conveniently established for all levels of packets at the beginning and end of an information stream as shown in the figures. This is not required, however, because packet boundaries may be established at any convenient location. For example, the information stream may be extended at either or both ends with one or more characters such as a "space" and packet boundaries established accordingly.

FIG. 3b illustrates level-1 and level-2 parsing for a second information stream which is similar but not identical to the first stream shown in FIG. 3a. The second information stream has been parsed into level-1 and level-2 packets using the same rules as those used to parse the first information stream. Because of the dissimilarities between the two streams, some of the level-2 packet boundaries in the second stream are not identical to corresponding level-2 packet boundaries in the first stream. For example, the boundaries near the string "jumped over" in FIG. 3a differ from the boundaries near the string "outran" in FIG. 3b. But significantly, the level-2 packet boundaries which are not in the vicinity of the dissimilarities are identical. For example, packets $P_1$, $P_2$, $P_4$ and $P_5$ are identical to packets $Q_1$, $Q_2$, $Q_4$ and $Q_5$, respectively.

FIG. 3c illustrates level-1 parsing of a third information stream which is dissimilar to the first and second streams. Despite the dissimilarities, context-insensitive parsing establishes the same level-2 packet boundaries in portions of the stream which are the same. For example, packets $Q_2$, $Q_3$ and $Q_5$ are identical to packets $R_2$, $R_3$ and $R_6$, respectively.

FIG. 3d is a hypothetical graphical representation of a square-wave signal in which the high-level portions of the waveform correspond to level-1 cardinal packets in the information stream of FIG. 3c. The up transitions correspond to level-2 packet boundaries. Conceptually, the signal represents packets in an information stream and the parsing process establishes the transitions within the signal. Each segment of an information stream has a corresponding waveform according to the rules used to classify and parse the stream. Whenever an information stream is changed which affects packet boundaries, the corresponding signal also changes.

For example, removing a segment from an information stream is conceptually similar to removing a corresponding segment of the square-wave signal. In effect, the waveform corresponding to the removed segment is cut out of the signal and the signal segments on either side of the cut are joined together. Any discontinuities in the signal caused by the removal are treated as new transitions. Up transitions are supposed to correspond to level-2 packet boundaries in the information stream, and conversely, the absence of up transitions is supposed to represent the absence of level-2 packet boundaries. In general, the addition of any new transitions or the deletion of any old transitions created by the removal will not accurately correspond to the addition or deletion of actual packet boundaries in the changed information stream.

Conceptually, context-insensitive parsing attempts to parse information streams in such a manner that the greatest possible number of up transitions in the square-wave signals corresponding to unchanged stream segments are preserved. This concept is analogous to a phase-lock loop; therefore, it may be helpful to explain that context-insensitive parsing attempts to achieve "aperiodic phase lock" as quickly as possible after any event which causes phase lock to be lost.

Embodiments of the present invention can provide context-insensitive parsing with a very broad range of packet classification and parsing rules. For most embodiments, aperiodic phase lock will be restored within an interval less than the length of two packets. For example, if phase lock is lost within packet $P_2$ of the sequence $P_1P_2P_3P_4$, aperiodic phase lock will be restored at or before the boundary between packets $P_3$ and $P_4$. It should be appreciated that phase lock will be restored at each level of a multiple-level parsing structure within the length of two packets at that level. It should also be appreciated that the present invention provides context-insensitive parsing for all types of data.

Many variations in parsing rules may be used to practice the present invention. For example, one parsing rule establishes level n+1 boundaries in an information stream just before any type "B" level n packet which immediately follows a type "A" level n packet. FIG. 4a illustrates one example of parsing according to this rule. A preferred variation of this rule establishes a level n+1 packet boundary just after any type "B" level n packet which immediately follows a type "A" level n packet. FIG. 4b illustrates one example of parsing according to this second rule. A comparison of the two figures reveals that the two rules parse the stream into level n+1 packets which contain the same numbers of level n packets, and the level n+1 packet boundaries generated by the second rule are merely delayed by one type "B" level n packet. Note that this parsing rule is stated independently of the classification rule used to classify the level n packets into type "A" and type "B" packets.

The two examples shown in FIGS. 4a and 4b illustrate that a parsing rule may establish packet boundaries in a variety of locations, but the rule should be consistent. For example, a rule which places the boundary between a type "A" packet and a following type "B" packet should always place the boundary between such packet pairs, but a rule which places the boundary just ahead of a type "A" packet followed by a type "B" packet should always place the boundary just ahead of such packet pairs.

"Local extrema" parsing rules establish boundaries in response to detecting a packet having a quantitative characteristic which is either a local maximum or a local minimum. Local extrema rules are special cases of the parsing rule discussed above which can be implemented by using a transition classification rule similar to rule 1 above. A local maximum can be found by detecting a type "B" packet followed immediately by a type "A" packet. Conversely, a local minimum can be found by detecting a type "A" packet followed immediately by a type "B" packet. Note in principle that the boundary may be established immediately prior to packet $P_2$, immediately after packet $P_2$, or at any other desirable position without effecting the concept of the parse. In preferred embodiments, the boundary is established immediately after packet $P_2$ in order to minimize processing delays and memory requirements.

An "oscillating" parsing rule may be implemented by alternating between two complementary classification rules. For example, if a boundary is established immediately after a packet P according to the intrinsic rule $$P = A \text{ if } |P| < TH, P = B \text{ otherwise,} \qquad (4a)$$

where TH is some threshold value, then the next boundary is established according to a complementary intrinsic rule, or $$P = A \text{ if } |P| \geq TH, P = B \text{ otherwise.} \qquad (4b)$$

Oscillating rules can be used to detect changes in the trend of some underlying quantitative characteristic.

Local extrema parsing rules may be divided into two types. "Full-cycle" parsing rules establish boundaries in an information stream in response to the detection of only local maxima or only local minima. "Half-cycle" parsing rules are oscillating type rules which establish boundaries based upon the detection of alternating local maxima and local minima. For example, the parsing rule discussed above in conjunction with FIG. 3c is a full-cycle rule which establishes level-2 packet boundaries which correspond to up transitions in the waveform shown in FIG. 3d. Level-2 packets correspond to full cycles of the waveform. A comparable half-cycle rule would establish packet boundaries corresponding to both up and down transitions in the waveform. Each level-2 packet would correspond to a half cycle of the waveform. The significance of these two types of rules is discussed below.

Parsing rules may also impose a lower and/or upper bound upon packet lengths. For example, a parsing rule may require that the length of each level n+1 packet be greater than some minimum number of level n packets and/or less than some maximum number of level n packets. Alternatively or in addition, a parsing rule may restrict the number of bits or bytes in a packet. Upper bounds may be necessary to help meet restrictions imposed by practical implementations or to provide for compactly organized dictionary structures. Unless bounds are required by some practical consideration, however, they are not used in preferred embodiments because they can increase the interval required to restore aperiodic phase lock.

4. Multiple-Level Parsing

The same principles underlying packet classification and parsing may be applied directly to multiple-levels of packets. A level n+1 packet contains one or more level n packets. The ratio between the average length of packets at level n and the average length of packets at level n+1 is the referred to herein as the "parsing ratio" at level n+1.

Lower parsing ratios are generally preferred because a parser can more quickly achieve aperiodic phase lock. Two-state packet classification rules which result in uncorrelated occurrences of equally likely packet types ensure that the parsing ratio is a minimum for a chosen parsing rule. Throughout the following discussion of multiple-level parsing, it is assumed that such a classification rule is used.

The parsing ratio for half-cycle parsing rules is approximately two. This can be shown by referring to the probability tree in FIG. 5. Each node of the tree represents the occurrence of either a type "A" level n packet or a type "B" level n packet. The distance from the root node represents the length of a specific sequence of level n packets and the fractional number next to each node indicates the probability that the corresponding packet sequence will occur. For this example, a level n+1 packet begins with a type "A" level n packet and ends after the first occurrence of a type "B" level n packet.

From the tree, it may be seen that the probability of occurrence is 0.5 for the packet sequence AB, 0.25 for AAB, 0.125 for AAAB, and so on. The sum of the products of each sequence length and probability converges to two. In other words, the average length of a level n+1 packet is equal to two level n packets. Therefore, the parsing ratio of a half-cycle parsing rule is two. It can be shown in a similar manner that the parsing ratio of a full-cycle parsing rule is four.

Even though half-cycle rules have a lower parsing ratio than full-cycle rules, they are used only at the highest parsing level in preferred embodiments because they perform poorly with alternating sequences of packets such as, for example, packet sequence ABABABAB. Generally, full-cycle rules guarantee that each level n+1 packet comprises two ore more level n packets. Half-cycle rules cannot provide this guarantee. Specifically, a half-cycle rule will parse a sequence of alternating level n packets into level n+1 packets which each contain exactly one level n packet. It should be emphasized that although half-cycle rules cannot guarantee a longer packet, the parsing ratio of half-cycle rules is approximately two.

5. Alternate Structure

FIG. 6 illustrates a functional block diagram of an alternate structure for one aspect of the present invention. Parsing processor 604 comprises packet classifier 606 and parser 610. Packet classifier 606 receives from path 602 an information stream comprising input packets and packet "flags" indicating the boundaries the input packets, and passes along path 608 the classification of each input packet. Parser 610 receives from path 602 the information stream and from path 608 each input packet classification within the information stream, and passes along path 612 the information stream with additional packet "flags" indicating the boundaries between output packets within the information stream. It will be apparent that many variations of the structures shown in FIGS. 1 and 6 are possible.

The previous discussions of classification rules, parsing rules, and multiple-level parsing generally apply to this and various other alternate structures.

B. Information Processor Embodiments

1. Compression Processor

FIG. 7 illustrates a functional block diagram of one embodiment of an information compression processor incorporating various aspects of the present invention. Parsing processor 706, which corresponds to the parsing processor illustrated in FIG. 2, receives input packet information from paths 702/704, parses the input packet information into higher-level packets in a manner similar to that described above, and passes the higher-level packet information along paths 708/710. Match processor 712 receives packet information from paths 708/710 and consults dictionary 716 via path 714 to determine if the packet information is in the dictionary. Match processor 712 receives from path 714 an indication whether the packet information is in the dictionary and, if the token is not in the dictionary, assigns a token to the packet information and passes the token and associated packet information along path 714 to update dictionary 716. Formatter 720 assembles token and packet information which it receives from path 718 into a form suitable for transmission or storage and passes the formatted information along path 722. In many applications, path 722 is connected to a communication channel or a storage medium.

In certain applications, match processor 712 passes token and packet information along path 718 in response to a request received from a path not shown in FIG. 7. If match processor 712 is aware of the contents of the requestor's dictionary, it can ensure that the formatted information passed along path 722 includes all packet information which is not in the dictionary.

Match processor 712 may utilize a number of known techniques for assigning tokens such as the sequential identifier, physical offset and algorithmic techniques discussed above. Examples of algorithmic techniques include calculating cyclical-redundancy-check (CRC) codes or consulting a hashing function. Additional examples of token assignment techniques are discussed in Williams, cited above. The specific technique used to assign tokens is not critical to the practice of the present invention.

The hashing function described in Pearson, cited above, is used to assign tokens in preferred embodiments of the present invention for various text applications. Very long keys are used to reduce the probability of hashing "collisions" to a level comparable to the probability of other failures in the information processing system such as transmission errors, computer memory malfunctions, and uncorrectable disk read/write errors. The use of very long keys permits use of a dictionary maintenance technique referred to here as "blind assimilation" which can significantly improve performance.

In many practical embodiments, the index portion of a dictionary can reside in random access memory (RAM) but the portion containing the defining packets must reside on disk. By using very long keys, an information processor can reasonably conclude that a packet is in a dictionary by merely making a very fast access to the index in RAM rather than making a much slower access to the dictionary definitions on disk.

The specific technique used to consult and maintain dictionaries is not critical to the practice of the present invention. Some examples of these techniques are described in Williams, cited above.

2. Decompression Processor

FIG. 8 illustrates a functional block diagram of one embodiment of an information decompression processor incorporating various aspects of the present invention. Deformatter 804 receives formatted information from path 802 and passes along path 806 token and packet information obtained by deformatting the formatted information. Match processor 808 receives the token and packet information from path 806, consults dictionary 812 via path 810 to determine if each token is in the dictionary and, if the token is in the dictionary, generates an information stream along path 8 14 containing the packet information associated with the token. If a token is not in the dictionary, match processor 808 passes the packet information along paths 814/816 to parsing processor 818. Parsing processor 818 parses the packet information into higher-level packets in a manner similar to that described above, and passes the higher-level packet information back to match processor 808 along paths 820/822. Match processor 808 assigns a token to the parsed packet information and passes the token and associated packet information along path 810 to update dictionary 812.

A decompression processor according to the embodiment shown in FIG. 8 must rely upon the formatted stream received from path 802 to provide the packet information for all tokens which do not exist in dictionary 812. In an alternate embodiment, match processor 808 may request packet information for any token which is not in dictionary 812. The request is sent along a path which is not shown in FIG. 8. This alternate embodiment is particularly useful for a node in a network where some other node is available to receive and respond to the request.

The specific token assignment and dictionary maintenance techniques used by match processor 808 is not critical to the practice of the present invention. Examples of these techniques are discussed herein and are provided in the references cited above.

3. Other Embodiments

The present invention is useful in a broad range of applications. For example, an information processor may utilize multiple-level context-insensitive parsing to (1) control a comparison utility which attempts to identify differences between two or more documents, (2) verify file contents to detect so-called computer viruses, or (3) index more efficiently a document search and retrieval system. For example, an information processor incorporating the present invention could efficiently search a large volume of documents containing a specified fragment of digitized audio or bit-mapped graphical image.

The present invention is applicable to information compression techniques which are not lossless. Lossy techniques are useful for compressing information streams representing video signals where various signal components such as DC-offset and signal jitter are preferably filtered out of the information stream prior to compression.

Many variations in embodiments of information processors incorporating the present invention are possible. The various embodiments described above are given by way of example only and illustrate that the present invention is applicable to a broad variety of structures and implementations.

I claim:

1. An information processor for processing an information stream comprising input packets, said information processor comprising
    input means for receiving said information stream and for receiving an indication of the boundaries in said information stream for each of said input packets,
    classification means for classifying said input packets according to intrinsic characteristics of said input packets,
    parsing means responsive to said classification means for parsing said input packets into output packets and for generating an indication of the boundaries of said output packets, wherein each of said output packets comprises or represents one or more of said input packets, and
    means for reiteratively classifying and parsing packets previously classified and parsed to generate further output packets comprising or representing one or more of said packets previously classified and parsed.

2. An information processor for processing an information stream comprising input packets, said information processor comprising
- input means for receiving said information stream and for receiving an indication of the boundaries in said information stream for each of said input packets,
- classification means for classifying said input packets according to transitions in quantitative characteristics of two or more of said input packets, and
- parsing means responsive to said classification means for parsing said input packets into output packets and for generating an indication of the boundaries of said output packets, wherein each of said output packets comprises or represents one or more of said input packets.

3. An information processor according to claim 1 or 2 wherein said parsing means generates an output stream comprising input packets parsed by said parsing means and said indication of the boundaries of said input packets.

4. An information processor according to claim 2 further comprising means for reiteratively classifying and parsing packets previously classified and parsed to generate further output packets comprising or representing one or more of said packets previously classified and parsed.

5. An information processor according to claim 1 or 2 wherein said classification means comprises means for classifying said input packets according to a modification of said characteristics to reduce the correlation of packet classification occurrences.

6. An information processor according to claim 1 or 2, wherein said parsing means establishes said boundaries of said output packets in response to local maxima or local minima of a quantitative characteristic of packets in said information stream.

7. An information processor according to claim 6, wherein said parsing means establishes said boundaries of said output packets in response to local minima alternating with local maxima of said quantitative characteristic.

8. An information processor according to claim 6, wherein said parsing means establishes said boundaries of said output packets in response to only one of either local minima or local maxima of said quantitative characteristic.

9. An information processing method for processing an information stream comprising input packets, said method comprising
- receiving said information stream and receiving an indication of the boundaries in said information strum for each of said input packets,
- classifying said input packets according to intrinsic characteristics of said input packets or transitions in quantitative characteristics of two or more of said input packets, and
- parsing said input packets into output packets in response to said classifying, and generating an indication of the boundaries of said output packets, wherein each of said output packets comprises or represents one or more of said input packets.

10. An information processing method according to claim 9 wherein said parsing generates an output stream comprising input packets parsed by said parsing and said indication of the boundaries of said input packets.

11. An information processing method for processing an information stream comprising input packets, said method comprising
- receiving said information stream and receiving an indication of the boundaries in said information stream for each of said input packets, wherein each of said input packets comprises or represents one or more previously parsed packets, said previously parsed packets having been parsed according to one or more intrinsic characteristics of said previously parsed packets,
- classifying said input packets according to intrinsic characteristics of said input packets, and
- parsing said input packets into output packets in response to said classifying and generating an indication of the boundaries of said output packets, wherein each output packet comprises or represents one or more of said input packets.

12. An information processing method according to claim 9 or 11 further comprising reiteratively classifying and parsing said output packets to generate further output packets comprising or representing one or more packets previously classified and parsed.

13. An information processing method according to claim 9 or 11 wherein said classifying classifies said input packets according to a modification of said characteristics to reduce the correlation of packet classification occurrences.

14. An information processing method according to claim 9 or 11, wherein said parsing establishes said boundaries of said output packets in response to local maxima or local minima of a quantitative characteristic of packets in said information stream.

15. An information processing method according to claim 14, wherein said parsing establishes said boundaries of said output packets in response to local minima alternating with local maxima of said quantitative characteristic.

16. An information processing method according to claim 14, wherein said parsing establishes said boundaries of said output packets in response to only one of either local minima or local maxima of said quantitative characteristic.

17. An information processor for processing an information stream comprising a sequence of input packets, said information processor comprising
- classification means for classifying said input packets into two or more classifications, and
- parsing means for establishing the start of an output packet in said information stream by establishing an output boundary between two input packets, wherein said parsing means establishes said output boundary in response to classifications of a limited number of input packets in said sequence preceding said output boundary.

18. An information processor according to claim 17 wherein said classification means classifies an input packet according to either an intrinsic characteristic of said input packet or transitions in quantitative characteristics of two or more packets in said sequence of input packets.

19. An information processor according to claim 17 wherein said limited number of input packets is equal to two.

20. An information processor according to claim 17 or 18 wherein said parsing means is responsive to classifications of input packets preceding said output boundary by more than said limited number of input packets for input streams in which said input packets are established according to a criterion other than packet classification according to either intrinsic characteristics of said input packets or transitions in quantitative characteristics of two or more of said input packets.

* * * * *

(12) EX PARTE REEXAMINATION CERTIFICATE (10335th)
United States Patent
Hekhuis

(10) Number: US 5,414,650 C1
(45) Certificate Issued: Oct. 16, 2014

(54) PARSING INFORMATION ONTO PACKETS USING CONTEXT-INSENSITIVE PARSING RULES BASED ON PACKET CHARACTERISTICS

(75) Inventor: Peter J. Hekhuis, Ashland, OR (US)

(73) Assignee: Compression Technology Solutions LLC, Frisco, TX (US)

Reexamination Request:
No. 90/012,924, Jul. 23, 2013

Reexamination Certificate for:
Patent No.: 5,414,650
Issued: May 9, 1995
Appl. No.: 08/035,438
Filed: Mar. 24, 1993

(51) Int. Cl.
*H03M 7/30* (2006.01)
*H03M 7/00* (2006.01)

(52) U.S. Cl.
USPC .......................................... 708/203; 341/51

(58) Field of Classification Search
None
See application file for complete search history.

(56) References Cited

To view the complete listing of prior art documents cited during the proceeding for Reexamination Control Number 90/012,924, please refer to the USPTO's public Patent Application Information Retrieval (PAIR) system under the Display References tab.

*Primary Examiner* — Sam Rimell

(57) ABSTRACT

Extremely localized parse rules, dependent only upon either intrinsic characteristics of each packet or upon transitions in characteristics between consecutive pairs or triples of packets, give a determinable fragmentation of an information stream which is relatively insensitive to imbedded error, insertion or deletion. Iterative application of such parsing on the stream of parsed fragments produces a corresponding hierarchy of levels of fragments of increasing length. The highest level fragments are matched to a dictionary or history, tokenized and presented for output to form a compressed data stream.

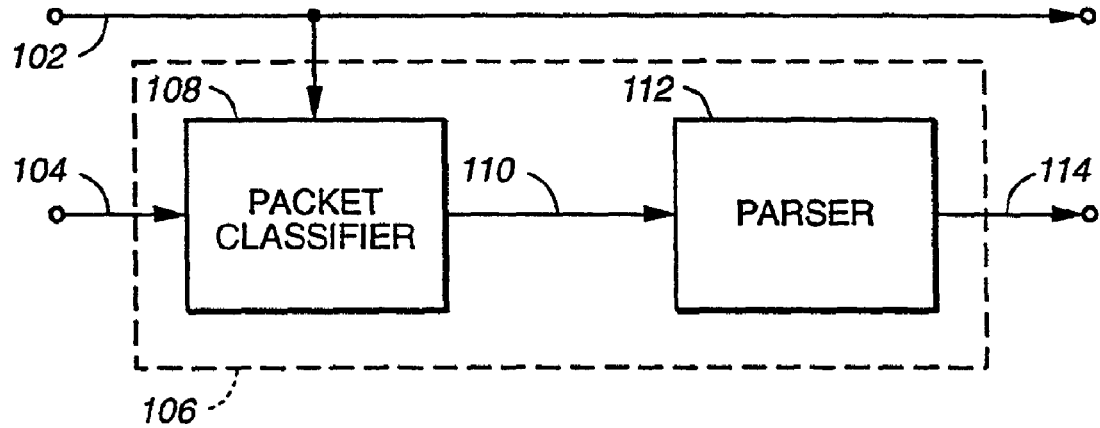

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-3 and 9-12 are cancelled.

Claims 4-8 and 13-20 were not reexamined.

\* \* \* \* \*